United States Patent Office 3,252,800 Patented May 24, 1966

3,252,800
PROCESS FOR PREPARATION OF IMPROVED PHOTOPOLYMERIZABLE LAYERS
Charles Walter Smith, Red Bank, N.J., assignor to E. I. du Pont de Nemours and Company, Wilmington, Del., a corporation of Delaware
No Drawing. Filed Mar. 21, 1963, Ser. No. 266,809
11 Claims. (Cl. 96—115)

This invention relates to a process for the preparation of improved photopolymerizable layers and elements. More particularly, it relates to a process for treating photopolymerizable printing elements prior to the photopolymerizing exposure which forms the printing element.

Photopolymerizable compositions and elements as described in assignee's U.S. patents, Plambeck U.S. 2,760,863 and 2,791,504, Barney U.S. 2,893,868, Martin U.S. 2,902,365, Martin et al., U.S. 2,927,022 and Smith U.S. 3,012,952 are useful in the preparation of printing reliefs, These compositions, in addition to other photopolymerizable compositions to be hereinafter described, contain inter alia, addition polymerizable ethylenically unsaturated monomeric and polymeric compounds, e.g., vinylidene and vinyl monomers, preferably of the acrylic or alkacrylic ester type, and polyacetals of essentially linear hydroxyl polymers having a plurality of intralinear vinyl alcohol (—$CH_2CHOH$—) groups and a plurality of extralinear vinylidene ($CH_2=R<$) groups in a conjugated system of double bonds, an organic polymer binder or filler material and an addition polymerization initiator activatable by actinic radiation. In practice, these compositions are coated on a suitable support such as an adhesive coated support in the manner described in assignee's Burg U.S. Patent No. 3,036,913, May 29, 1962. The element is exposed through a suitable light stencil, e.g., a photographic process transparency, to actinic radiation which causes the ethylenically unsaturated material to photopolymerize and become substantially insoluble in the exposed areas. Following exposure, the element is treated with a solution which dissolves the composition in the unexposed areas but not in the exposed areas. The resulting product is a relief image element useful for printing and other applications.

It has been found, however, that certain relief plate defects may be encountered which appear to be due to insufficient hardness of the surface of the photopolymerizable layer. For example, the usual so-called process negative used in the graphic arts trade to expose the photopolymerizable printing element has a matte surface. In exposing the printing element, the process negative is placed over said printing element in a conventional vacuum printing frame and a vacuum of about 26 inches of mercury is drawn. This is for the purpose of providing intimate contact between the negative and photopolymerizable element in order to obtain accurate reproducibility. However, because of insufficient surface hardness of the photopolymerizable elements of the above patents, the negative may become imbedded in the photopolymer layer. This causes loss of halftone detail.

In working with the photopolymerizable elements described above it has been found that the sensitivity of the photopolymerizable printing plates can be improved by placing the plates in an atmosphere in which the partial pressure of oxygen is very low as in an inert-gas-oxygen atmosphere in the manner taught by assignee's Crawford U.S. application Ser. No. 787,820 filed Jan. 20, 1959 (abandoned). During exposure of the element in a vacuum frame, however, the oxygen supply at the plate surface can vary due to nonuniform contact between the element surface and the photographic negative. This is because the photopolymerizable compositions of the above patents generally lack sufficient hardness to prevent embedding of the matte negative into the surface of the photopolymerizable element particularly with the elevated temperatures reached during exposure. The imbedding of the negative into the photopolymerizable layer causes defects in the relief element which take the form of poor uniformity of highlight dot size and shallow shadow wells which plug and cause poor printing.

An object of this invention is to provide new and improved photopolymerizable elements. Another object is to provide photopolymerizable elements having improved surface characteristics. Another object is to provide photopolymerizable elements which result in relief printing elements free of surface defects caused by an excessively soft photopolymerizable surface. A still further object is to provide a photopolymerizable element having an exposable surface which, when exposed by means of a matte process negative, gives a relief printing element of improved sensitometric characteristics in the form of small and uniform highlight dots and shadow wells of increased depth.

The process of this invention comprises treating with a fluid, e.g., vapor or liquid, preferably a solution embodying a carboxylate salt-forming compound the photopolymerizable surface of a photopolymerizable element having a support, e.g., a metal or polymer sheet or plate and a solid photosensitive layer 3 to 250 mils or more in thickness comprising (1) an addition polymerizable ethylenically unsaturated compound, e.g. monomer or polymer and (2) a polymeric binder having free carboxyl groups.

Among the carboxylate salt-forming compounds which may be used, preferably in aqueous solution, are: sodium acetate, sodium chloride, sodium hydroxide, sodium carbonate, sodium silicate, sodium sulfate; ammonium salts, e.g., ammonium acetate, ammonium hydroxide. Multivalent salts may also be used, e.g., calcium, barium, lead, zinc, cobalt, copper, uranium, etc. For example, tetramine copper (II) acetate has been found useful in the invention. Ordinarily, about a 0.1 to 1 molar aqueous solution of the carboxylate salt-forming compound will be effective in the process. The unexposed photopolymerizable layer need only be subjected to the salt-forming solution at room temperature for from 30 seconds to 10 minutes. After treatment, the plates are dried, preferably conditioned in an inert atmosphere in the manner described in the above Crawford application, and then exposed in the usual manner.

Preferably the photopolymerizable solid layers treated in accordance with the invention comprise (1) An addition polymerizable, non-gaseous ethylenically unsaturated compound containing at least one terminal ethylenic group ($CH_2=C<$), having a boiling point above 100° C. at normal atmospheric pressure and being capable of forming a high polymer by free-radical initiated, chain propagating addition polymerization, and (2) A preformed, compatible macromolecular polymeric binding agent having free carboxyl groups capable of forming salt groups in alkaline solution, e.g., cellulose acetate succinate and cellulose acetate glutarate, or any of such binding agents that are described in the patents referred to above. Components (1) and (2) are present in amounts of 10 to 60 and 40 to 90 parts by weight, respectively.

Particularly preferred solid layers, in addition, contain (3) A free-radical generating addition polymerization initiator activatable by actinic radiation in an amount from 0.001 to 10 parts by weight of components (1) and (2), and, optionally, (4) A thermal addition polymerization inhibitor in an amount from .001 to 6.0 parts by weight of components (1) and (2).

The preformed macromolecular polymer binding agents referred to above and disclosed in the patents listed above form solid, hard, coherant films. The preferred binding agents are cellulose esters of basic carboxylic acids.

In the photopolymerizable layers treated in accordance with the invention, the ethylenically unsaturated compound (1) which is capable of polymerizing or forming a high polymer in a short period of time by photoinitiated, chain-propagating, addition polymerization can be any of the monomeric compounds disclosed in Plambeck U.S. Patent 2,760,863 and any of the polymeric compounds disclosed in Martin U.S. 2,929,710 and those disclosed in Martin 2,892,716. Preferably the compounds are nongaseous at 20° C. and atmospheric pressure, have 1 to 6 or more terminal ethylenic groups, preferably two or more, and a plasticizing action on the thermoplastic polymer in addition to its other properties disclosed above. Suitable compounds, which may be used alone or in combination, include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Patent 2,927,022, e.g., those having a plurality of addition polymerizable ethylenic linkages, particularly when present as terminal linkages, and especially those wherein at least one and preferably most of such linkages are conjugated with a doubly bonded carbon, including carbon double bonded to carbon and to such heteroatoms as nitrogen, oxygen and sulfur. Outstanding are such compounds wherein the ethylenically unsaturated groups, especially the vinylidene groups, are conjugated with ester or amide structure, e.g., polyacetals, polyamides, etc. Specific compounds further illustrative of this class are:

Unsaturated esters of alcohols, preferably of polyols and particularly such esters of the alphamethylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol triacrylate and trimethacrylate, pentaerythritol tetraacrylate and tetramethacrylate, 1,3-propanediol diacrylate, 1,5-pentanediol dimethacrylate, the bis-acrylates and methacrylates of polyethylene glycols of molecular weight 200–1500, and the like; unsaturated amides, particularly those of the alphamethylene carboxylic acids, and especially diamines, such as methylene bis-acrylamide, 1,6-hexamethylene bis-acrylamide, diethylene triamine tris-methacrylamide, bis-(gamma-methacrylamidopropoxy) ethane, beta-methacrylamidoethyl methacrylate, N-(beta-hydroxyethyl)-beta-(methacrylamido) ethyl acrylate and N,N-bis(beta-methacrylloxyethyl)-acrylamide; vinyl esters such as divinyl succinate, divinyl adipate, divinyl phthalate, divinyl terephthalate, divinyl benzene-1,3-disulfonate, divinyl butane-1,4-disulfonate; styrene and derivatives thereof and unsaturated aldehydes, such as sorbaldehyde (hexadienal). An outstanding class of these preferred addition polymerizable compounds are the esters and amides of alphamethylene carboxylic acids and substituted carboxylic acids with polyols and polyamines wherein the molecular chain between the hydroxyls and amino groups is solely carbon or oxygen interrupted carbon, e.g., m-methacrylamidobenzaldehyde polyvinyl acetal, n-butyraldehyde polyvinyl acetal containing methacrylyloxy groups, etc. The preferred monomeric compounds are the di- or poly-functional, but monofunctional monomers can also be used. The amount of the ethylenically unsaturated material added varies with the particular thermoplastic polymer used. Suitable binding agents (2) are those in which the free carboxyl groups of the agent can be converted into the soluble salt. Such binding agents include cellulose esters made with a dicarboxylic acid, such as the preferred cellulose acetate succinate and the corresponding esters of maleic and glutaric acids as well as the esters of aromatic dicarboxylic acids, e.g., of phthalic acid, tetrahydrophthalic acid, endo-cis-bicyclo(2,2,1)-5-heptene-2,3-dicarboxylic acid. Additional binding agents are:

A polyvinyl alcohol derivative containing lateral free acid (e.g., oxyacid) groups which form soluble salts, more particularly the monovalent alkali metal, ammonium or substituted ammonium or amine salts, which derivative is soluble to the extent of at least 10% by weight in 2% aqueous ammonia solution as disclosed in assignee's Martin U.S. Patent 2,902,365; a cellulose derivative containing lateral free oxyacid groups which is soluble to the extent of at least 10% by weight in 1% aqueous ammonia solution and may contain as inert ingredients up to 35% by weight of inert organic or inorganic filler material as disclosed in assignee's Martin and Barney U.S. Patent 2,927,022 March 1, 1960.

Present in the preferred photopolymerizable compositions are photoinitiators (3) preferably those activatable by actinic light and thermally inactive at and below 185° C. which include the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 3-chloroanthraquinone, 2-methylanthraquinone, 2-ethyl-anthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfuric acid, 3-chloro-2-methylanthraquinone, retenequinone, 7,8,9,10-tetrahydronaphthacenequinone, and 1,2,3,4-tetrahydro(a) anthracene-7,12-dione. Certain aromatic ketones, e.g., benzophenone, are also useful as are the following photoinitiators, some of which may be thermally active at temperatures as low as 85° C., e.g., those described in Plambeck U.S. Patent 2,760,863 and include vicinal ketaldonyl compounds, such as diacetyl, benzil, etc., alpha-ketaldonyl alcohols, such as benzoin, pivaloin, etc.; acryloin ethers e.g., benzoin methyl and ethyl ethers, etc.; alpha-hydrocarbon substituted aromatic acryloins, including alpha-methylbenzoin, alpha allylbenzoin, and alpha-phenylbenzoin. Silver persulfate is also useful as a free-radical generating initiator activatable by actinic radiation, as are the azo initiators disclosed in assignee's Burg applications Serial No. 156,129 and 156,530, filed December 1, 1961, now abandoned.

Thermal polymerization inhibitors (4) are also present in the preferred compositions, including p-methoxyphenol, hydroquinone, and alkyl and aryl-substituted hydroquinones and quinones, tert-butyl catechol, pyrogallol, copper resinate, naphthylamines, beta-naphthal, cuprous chloride, 2,6-di-tert-butyl p-cresol, phenothiazine, pyridine, nitrobenzene and dinitrobenzene, in addition to p-toluquinone and chloroanil.

At least one stratum of the photopolymerizable composition is coated on a base support. Suitable bases or supports include those disclosed in U.S. Patent 2,760,863, metals, glass, wood, cellulose esters, e.g., cellulose butyrate, etc., and other plastic compositions such as polyamides, polyesters, e.g., polyethylene terephthalate, etc. The support may have in its thickness or on its surface and beneath the outer photopolymerizable stratum, an antihalation layer as disclosed in said patent or other substrata needed to facilitate anchorage to the base, e.g., the adhesive compositions disclosed in the Burg U.S. Patent 3,036,913 noted above.

As previously described, the invention is also useful with photopolymerizable elements containing more than one stratum of photopolymerizable composition as disclosed in Plambeck U.S. Patent 2,964,401; Crawford U.S. Patent 2,993,789; and assignee's Notley application Serial No. 788,501, filed January 23, 1959, now U.S. Pat. No. 3,157,505.

The photopolymerizable elements are exposed to a source of actinic radiation. This may be through a two-tone image or a process transparency, e.g., a process negative or positive (an image-bearing transparency consisting solely of substantially opaque and substantially transparent areas where the opaque areas are substantially of the same optical density, the so-called line or halftone negative or positive) or a stencil.

Since free-radical generating addition-polymerization initiators activatable by actinic radiation generally exhibit their maximum sensitivity in the ultraviolet range, the radiation source should usually furnish an effective amount of this radiation. Both point and broad radiation sources are effective. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sunlamps, are most suitable. The sunlamp mercury-vapor arcs are customarily used at a distance of one and one-half to 24 inches from the photopolymerizable layer. The point sources are generally used at a distance of 20 up to about 40 inches from the photopolymerizable element. It is noted, however, that in certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light. As stated previously, the photopolymerizable compositions after exposure can be developed, e.g., by impingement of spray jets, etc., including brushing and scrubbing, to the desirable images with aqueous bases, i.e., aqueous solutions of water-soluble bases in concentrations generally in the range from 0.01% to 10% by weight. Higher concentrations of course can be used, but no improved result is obtained thereby. Depending upon the organic/aqueous base partition solution coefficient of the acidic polyvinyl alcohol derivatives, minor amounts of compatible organic solvents will frequently be found to be efficacious in the development medium, such as: the short chain alcohols, e.g., methyl and ethyl alcohol; the ketones, e.g., acetone, ethyl methyl ketone and cyclohexanone.

Suitable bases for development include the alkali metal hydroxides, e.g., lithium, sodium and potassium hydroxide; the base-reacting alkali metal salts of weak acids, e.g., lithium, sodium, and potassium carbonates and bicarbonates; amines having a base-ionization constant greater than about $1 \times 10^{-6}$. For reasons of greater availability, ease in handling and low costs, the preferred bases are the alkali metal hydroxides, the alkali metal base-reacting salts of weak acids, especially sodium and potassium bicarbonate, and carbonate; and the hydroxylamines.

In a preferred aspect of this invention, photopolymerizable plates of the type described above are immersed at room temperature for from 30 seconds to 30 minutes and preferable from 1 to 10 minutes in an aqueous solution of a salt and dried. The treated plates can then be exposed to photopolymerizing radiation to form high quality relief printing plates which show no evidence of embedding of the photographic negative into the photopolymer layer. The so-treated plates can be exposed and processed in the usual manner and used on standard printing presses.

The above treatment may also be combined with other treatments such as that described in assignee's copending Thommes application U.S. Serial No. 170,511, filed February 1, 1962, which is concerned with treating the alkaline washed relief printing plate with an acid to remove the monovalent metal cation. This process has many advantages when the plate is to be used only for printing; because the monovalent alkali metal salt form of the binder formed by processing and by washing the exposed plate in dilute alkali causes the plate to be very water sensitive and exhibit increased swelling in water, especially in the small highlight dot areas of halftones, and have excess cupping of small dots. Cupping is the difference in height of the dot from the edge to the center, i.e., a concave printing surface. The above referred to acid treatment removes the above objections and provides a relief printing plate having less moisture sensitivity and better character structure for printing.

To test the effectiveness of the treatment of the photopolymerizable layer, the hardness of the surfaces of the layers were determined according to the conventional Knoop hardness procedures using a Tukon microhardness tester manufactured by the Wilson Mechanical Instrument Division of the American Chain and Cable Company.

The invention will be further illustrated by, but is not intended to be limited to the following examples.

*Example I*

Four lots of a photopolymerizable composition comprising 30 parts of triethylene glycol diacrylate, 67 parts of cellulose acetate succinate with a degree of acetyl substitution of 1.9 and of succinyl substitution of 0.7, 0.13 part of 2-ethylanthraquinone and 0.13 part of p-methoxyphenol were prepared according to Smith U.S. Patent 3,012,952. The compositions were pressed into sheets of about 20-mil thickness and bonded to adhesive covered steel plates, about 10 mils thick, according to assignee's Burg U.S. Patent 3,036,913 to form eight photopolymerizable elements. Four of the elements were immersed in an aqueous solution of one-molar sodium acetate for five minutes. All of the elements were then conditioned to equilibrium at 20% relative humidity and the hardness measured according to the procedure outlined above with the following results in terms of Knoop hardness numbers.

| Control: | Treated element |
|---|---|
| 1.86 | 7.49 |
| 2.19 | 7.56 |
| 2.59 | 8.63 |
| 2.26 | 6.33 |

It will be seen that surface hardness increased in every case. All of the treated elements were suitable for the preparation of good quality printing plates as described in the above patents.

*Example II*

A mixture of 40 parts of a partially hydrolyzed cellulose acetate (43.7% combined acetic acid, degree of substitution=1.70), 50 parts of succinic anhydride, and 10 parts of potassium acetate in 258 parts of dioxane was heated with stirring at 95° C. for about 18 hours. The reaction mixture was then poured with stirring into an excess of water and the resultant white solid product removed by filtration, washed with water, and dried to yield 31 parts of cellulose acetate hydrogen succinate having a total degree of substitution of 2.88, an acid degree of substitution of 1.13, a neutral degree of substitution (number of neutral substituents per glucose unit) of 1.75 and a neutral equivalent of 306.

Two lots of a photopolymerizable composition containing triethylene glycol diacrylate were made to form two printing elements using the above cellulosic compound as described in Example VII of Plambeck U.S. 2,964,401. The resulting printing elements were each cut into two pieces, one each of which was used as a control. The other two pieces were immersed for 5 minutes in a one-molar aqueous solution of sodium acetate and dried. All of the elements were then brought to equilibrium at 20% relative humidity and the hardness measured as described in Example I with the following results in terms of Knoop hardness numbers.

| Control: | Treated elements |
|---|---|
| 2.38 | 8.47 |
| 2.72 | 10.39 |

*Example III*

Two printing elements using cellulose acetate succinate and polyethylene glycol diacrylate were made in the manner described in Example I of Smith U.S. 3,012,952. Each of the elements was cut into two pieces, one of each of which was used as a control. The other two pieces were treated by immersing them for 5 minutes in a one molar aqueous solution of sodium acetate and dried. All of the elements were conditioned to equilibrium at 20% relative humidity and the hardness measured as described above with the following results in terms of Knoop hardness numbers.

| Control: | Treated elements |
|---|---|
| 0.67 | 1.76 |
| 1.17 | 3.08 |

*Example IV*

Example III was repeated using .04 molar aqueous solution of sodium acetate with following results in terms of Knoop hardness numbers.

| Control: | Treated elements |
|---|---|
| 0.67 | 1.69 |
| 1.17 | 2.81 |

*Example V*

A photopolymerizable element was made according to Example II and cut into three pieces, one of which was used as a control. Each of the two pieces was immersed for 30 seconds and 4 minutes respectively and the hardness measured with the following results.

| Treatment: | Knoop hardness |
|---|---|
| Control, none | 1.76 |
| 30-second immersion in one molar sodium acetate | 2.53 |
| 4-minute immersion in above solution | 3.93 |

It will be seen that while even a 30-second immersion improves the surface hardness, it may be further improved by extended immersion. The treated photopolymerizable elements were quite suitable for producing high quality relief printing plates in the known manner.

*Example VI*

A printing element was made in the manner described in Example I except that polyethylene glycol diacrylate (average molecular weight of the diol precursor was 300) was used in place of the triethylene glycol diacrylate. The resulting photopolymerizable element was divided into eleven pieces which were treated by immersion in the solutions set forth in the following table for the times indicated and rinsed in a 0.25% aqueous solution of sodium lauryl sulfonate. The plates were dried and tested for hardness after conditioning to equilibrium at 20% relative humidity.

| Treatment: | Hardness |
|---|---|
| Control, none | 0.78 |
| 0.5 M sodium acetate, 5 minutes | 1.61 |
| 1.0 M sodium acetate, 5 minutes | 2.14 |
| 0.1 M sodium carbonate, 5 minutes | 2.27 |
| 1.0 M sodium chloride | 1.12 |
| Ammonia+$H_2O$ vapor atmosphere, 5 minutes | 4.92 |
| 1.0 M sodium metasilicate, 5 min. | 7.70 |
| 1.0 M ammonium acetate, 5 minutes | 1.78 |
| 0.1 M ammonium hydroxide, 6 min. | 1.56 |
| 0.1 M sodium metasilicate, 5 min. | 1.78 |

*Example VII*

An element made as described in Example VI was cut into two pieces, one of which was immersed in 0.5 M sodium acetate for 5 minutes, rinsed and dried as described in said example. The plates were conditioned in an inert gas atmosphere as described in assignee's Crawford application Serial No. 787,820 filed Jan. 20, 1959 (abandoned) and then exposed as described in Example I of said application. A measurement of the depth of the three-mil halftone dots in the shadow area showed 0.72-mil for the untreated plate and 1.16 mil for the treated plate. This is a significant improvement in shadow well depth. The hardness of the plates was 1.86 for the control and 6.23 for the treated plate. Plates conditioned for 72 hours as described above were exposed through a negative having 3-mil highlight dots. Measurement of the relief plate highlight dot diameter gave 3.1 mils for the control and 2.0 mils for the treated plate. This showed good highlight dot attenuation. This is useful in many printing applications.

*Example VIII*

Two hundred eighty grams of cellulose acetate (degree of acetyl substitution 1.85) which had been finely pulverized in a mechanical pulverizer so that the particles could pass through a screen with 0.010 inch openings, 208 grams of triethylene glycol diacrylate, 147 grams of glutaric anhydride, 0.2 gram of anthraquinone and 0.2 gram of p-methoxyphenol were placed in a planetary mixer, the blades of which were operated by an electric motor. The mixture was then placed on a preheated two roll rubber mill internally heated by steam, the rolls of which are smooth cylinders 10 inches in diameter and 20 inches in length and was admixed at 125° C. for five minutes. Forty-two and six-tenths grams of diethylcyclohexylamine was added to the mixture on the mill and was allowed to work into the mixture by milling for 15 minutes at 140–150° C. The degree of substitution of the glutaryl group on the cellulose acetate was determined to be 0.78. The photopolymerizable composition was formed into a sheet 40-mils thick by pressing at 170° C. under a pressure of 1000 pounds per square inch inch. The pressed sheet was laminated to a sheet of aluminum 15-mils thick by the procedure described in Example V of Burg U.S. Patent 3,036,913, to form eight photopolymerizable elements. Four of the elements were immersed in an aqueous solution of one molar sodium acetate for five minutes. All of the elements were then conditioned to equilibrium at 20% relative humidity and the Knoop hardness measured according to the procedure outlined above with the following results.

| Control: | Treated element |
|---|---|
| 0.9 | 3.5 |
| 1.0 | 3.2 |
| 0.8 | 3.0 |
| 1.2 | 4.6 |

*Example IX*

A photopolymerizable element was made according to Example I except that a portion of triethylene glycol diacrylate was substituted by polyethylene glycol diacrylate (average molecular weight of the diol precursor was 300) such that the quantities of polyethylene glycol diacrylate and triethylene glycol diacrylate were in a ratio of 1:3. The resulting photopolymerizable elements were treated in cupric acetate, sodium hydroxide and diethylcyclohexylamine as indicated in the following table with the results shown.

| Treatment: | Knoop hardness |
|---|---|
| Control, none | 0.48 |
| 0.1 N $Cu(Ac)_2$, 5 seconds | 0.63 |
| 0.1 N $Cu(Ac)_2$, 10 seconds | 0.83 |
| 0.1 N $Cu(Ac)_2$, 5 minutes | 2.24 |
| 0.1 N sodium hydroxide, 5 sec. | 0.62 |
| 0.1 N sodium hydroxide, 10 sec. | 1.27 |
| 0.1 N sodium hydroxide, 30 sec. | 1.23 |
| Diethylcyclohexylamine vapors, 20 hours | .96 |

It will be noted that although some treating agents were not as effective as others the invention affords a wide choice of materials which are useful in bringing about the effect.

The process of the invention can be applied to all photopolymerizable elements made in accordance with the teachings of the patents and patent applications referred to above. The elements treated in accordance with the process can be used advantageously to form printing elements useful in all classes of printing including lithography but are most applicable to those classes of printing wherein a distinct difference of height between printing and non-printing surfaces is required.

An advantage of this invention is that the so-treated photopolymerizable elements after exposure and processing result in relief printing elements having smaller highlight dots and deeper shadow wells. A further advantage is that the so-treated plates are freer of surface defects. A still further advantage is that the photopolymerizable elements treated with the carboxylate salt forming compounds prevent embedding of a matte process negative during exposure in a vacuum printing frame and thus allows a uniform circulation of air over the surface of the element.

I claim:

1. A process for improving the surface characteristics of a solid photopolymerizable layer having essentially uniform surface characteristics comprising (1) at least one addition polymerizable ethylenically unsaturated compound containing at least one terminal ethylenic group, and (2) an organic polymer binding agent having free carboxylic acid groups capable of forming salt groups in alkaline solution, characterized in that said solid layer is treated with a fluid embodying a carboxylate salt-forming compound whereby the surface is essentially uniformly hardened by the formation of salts with said acid groups.

2. A process according to claim 1 wherein said fluid is an aqueous solution.

3. A process according to claim 1 wherein said fluid is an aqueous solution of a water-soluble sodium salt.

4. A process according to claim 1 wherein said solution is an aqueous solution of sodium acetate.

5. A process according to claim 1 wherein said fluid is a vapor.

6. A process according to claim 1 wherein said polymer is a cellulose carboxylic acid ester of a dibasic carboxylic acid.

7. A process according to claim 1 wherein said unsaturated compound is a polyglycol ester of an acrylic acid and said polymer is cellulose acetate succinate.

8. A process according to claim 1 wherein the layer is treated by immersion in said solution.

9. A process for improving the surface characteristics of a photopolymerizable printing element having a support and a photopolymerizable solid layer having essentially uniform surface characteristics comprising (1) at least one addition polymerizable, non-gaseous ethylenically unsaturated compound containing at least one terminal ethylenic group, having a boiling point above 100° C. at normal atmospheric pressure and being capable of forming a high polymer by free-radical initiated, chain propagating addition polymerization, and (2) a preformed, compatible macromolecular binding agent that forms solid coherent films and contains free carboxyl groups, said components (1) and (2) being present in amounts of 10 to 60 and 40 to 90 parts by weight, respectively; characterized in that said solid layer is treated with a solution of a carboxylate salt forming compound and then dried, whereby the surface is essentially uniformly hardened by the formation of salts with said carboxyl groups.

10. A process according to claim 9 wherein said solution is an aqueous solution of a water-soluble sodium salt.

11. A process according to claim 9 wherein said binding agent is cellulose acetate succinate.

References Cited by the Examiner

UNITED STATES PATENTS 3,129,098 4/1964 Kitson ---------------- 96—35

J. TRAVIS BROWN, *Acting Primary Examiner.*

NORMAN G. TORCHIN, *Examiner.*

T. J. HOFFMANN, R. H. SMITH, *Assistant Examiners.*